(12) United States Patent
AlAwfi

(10) Patent No.: US 10,235,080 B2
(45) Date of Patent: Mar. 19, 2019

(54) SYSTEMS AND METHODS FOR ASSESSING UPSTREAM OIL AND GAS ELECTRONIC DATA DUPLICATION

(71) Applicant: Saudi Arabian Oil Company, Dhahran (SA)

(72) Inventor: Sami N. AlAwfi, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 164 days.

(21) Appl. No.: 15/615,003

(22) Filed: Jun. 6, 2017

(65) Prior Publication Data

US 2018/0349054 A1 Dec. 6, 2018

(51) Int. Cl.
  *G06F 17/00* (2006.01)
  *G06F 3/06* (2006.01)
  *H03M 7/30* (2006.01)
  *G06K 9/62* (2006.01)
  *G06F 16/174* (2019.01)

(52) U.S. Cl.
  CPC .......... *G06F 3/0641* (2013.01); *G06F 3/0608* (2013.01); *G06F 16/1748* (2019.01); *G06K 9/628* (2013.01); *H03M 7/3091* (2013.01)

(58) Field of Classification Search
  CPC ............. G06F 17/30156; G06F 3/0641; G06F 11/1453; G06F 17/30159; G06F 3/067
  See application file for complete search history.

(56) References Cited

U.S. PATENT DOCUMENTS

| | | |
|---|---|---|
| 7,401,080 B2 | 7/2008 | Benton et al. |
| 8,165,221 B2 | 4/2012 | Zheng et al. |
| 8,271,462 B2 | 9/2012 | Wang et al. |
| 8,311,964 B1 | 11/2012 | Efstathopoulos et al. |
| 8,412,848 B2 | 4/2013 | Therrien et al. |
| 8,442,956 B2 | 5/2013 | Tofano |
| 8,572,053 B2 | 10/2013 | Tofano |
| 8,601,014 B2 | 12/2013 | Mungi |
| 8,660,998 B2 | 2/2014 | Kato |
| 8,682,869 B2 | 3/2014 | Baldwin et al. |

(Continued)

OTHER PUBLICATIONS

International Search Report and Written Opinion for International Application No. PCT/US2018/035948; International Filing Date Jun. 5, 2018; Report dated Jul. 31, 2018 (pp. 1-12).

(Continued)

*Primary Examiner* — Truong V Vo

(74) *Attorney, Agent, or Firm* — Bracewell LLP; Constance G. Rhebergen; Christopher L. Drymalla

(57) ABSTRACT

Provided in some embodiments are systems and methods for assessing electronic data duplication. Embodiments include extracting first samples of electronic data files and applying a first hash function to the first samples to generate first hash digests. Determining first groupings of the electronic data files having a same file size and first hash digest. Extracting second samples the electronic data files of the first groupings and applying a second hash function to the second samples to generate second hash digests. Determining second groupings the electronic data files having a same file size, a same first hash digest and a same second hash digest. Applying a third hash function to the contents of the electronic data files of the second groupings to generate third hash digests. Determining duplicate electronic data files having a same file size and same first, second, and third hash digests.

21 Claims, 6 Drawing Sheets

(56) References Cited

U.S. PATENT DOCUMENTS

| | | |
|---|---|---|
| 8,688,652 B2 | 4/2014 | Baldwin et al. |
| 9,110,936 B2 | 8/2015 | Li et al. |
| 9,116,941 B2 | 8/2015 | Aronovich |
| 9,244,937 B2 | 1/2016 | Akirav et al. |
| 9,268,497 B2 | 2/2016 | Baldwin et al. |
| 2012/0191675 A1 | 7/2012 | Kim et al. |

OTHER PUBLICATIONS

Min, Jaehong, et al.; "Efficient Deduplication Techniques for Modern Backup Operation" IEEE Transaction on Computers, vol. 60, No. 6, Jun. 2011; pp. 824-840.

SYSTEMS AND METHODS FOR ASSESSING UPSTREAM OIL AND GAS ELECTRONIC DATA DUPLICATION

FIELD OF INVENTION

The present invention relates generally to assessment of electronic data and more particularly to systems and methods for assessing oil and gas upstream electronic data duplication using adaptive file digests.

BACKGROUND OF THE INVENTION

With the advancement of computer technologies, many industries have seen dramatic increases the amount of electronic data being generated and processed. This can include, for example, raw electronic data streams, electronic data files, and the like. In the oil and gas upstream industry, for example, extremely large amounts of electronic data is generated and processed in the context of assessing formations for the presence of hydrocarbons (oil and gas), managing drilling operations, optimizing production, and the like. This can include seismic data, well log data, reservoir models, field development plans, and the like. In many industries, various processes are employed in an effort to effectively store, manage and process electronic data. Unfortunately, as the amount of electronic data grows the likelihood of duplicate electronic data and the amount of duplicate electronic data can increase significantly. This can lead to performance issues and increase the complexity of infrastructure due to the overhead required to store, manage and process the increased amount of electronic data. This is especially true for the oil and gas industry and, in particular, for the oil and gas upstream industry in which extremely large datasets are generated for managing oil and gas upstream operations.

SUMMARY OF THE INVENTION

Applicants have recognized that existing techniques for managing electronic data, including oil and gas upstream electronic data, can be inefficient and ineffective. For example, Applicants have recognized that existing processes for electronic data deduplication (e.g., identifying and/or removing duplicate sets of electronic data) can require unneeded processing of data, which can significantly reduce performance. In particular, certain existing electronic data deduplication techniques employ processing of large chucks of data blocks (e.g., entire contents of electronic files in question) and/or comparisons of a large amount of data (e.g., one-to-one comparisons of an entire group of electronic data files in question) which can generate a substantial amount of processing overhead. For example, certain existing data deduplication techniques include hashing a relatively large amount of the contents of all electronic data files being assessed for deduplication (e.g., hashing of the entire contents of all of the electronic data files being assessed for deduplication), as well as conducting one-to-one comparisons of all of the resulting hash digests to determine which, if any, of the electronic data files are duplicates. As another example, some deduplication techniques involve dividing a stream of data or a data file into blocks (e.g., consecutive bytes or elements of data) and hashing every block to identify duplicated blocks or portions of data. Applicants have recognized that such hashing techniques and one-to-one comparisons can increase processing overhead (resulting in longer processing times) and require a complex processing infrastructure including, for example, faster (or more) processors to provide suitable processing power and/or additional memory to store the resulting hash digests for comparison. Moreover, techniques that treat all data files the same way (e.g., hashing all of the contents of data files) are not adaptive.

Applicants have also recognized that certain existing data deduplication techniques rely on hashing first portions of data files, and iteratively hashing increasingly larger first portions of the data files until it is determined that files are unique or duplicates. Unfortunately, such a technique will perform poorly if, for example, the first portions of the files being compared are similar and the unique portions of the files are toward the end of the data files and thus subject to hashing in later iterations. This is especially true in the case of files sharing a common header in a first portion of the files, such that hashing first portions of the file may not provide any indication that files are unique. Also some files, like seismic data or satellite image files, store information according to their spatial location. For example images that share some portions with other images will have long sequence of identical bytes corresponding to the identical portions of the images. This can have a negative effect on the performance of any technique that examines consecutive portions of the files, as the examined portions may be identical and not provide any indication that files are unique.

In addition to the above, Applicants have recognized that certain existing data deduplication techniques rely on determining and comparing electronic data file characteristics (e.g., a file name, file extension, file modification date or the like) that may not provide an accurate assessment of data duplication. For example, a technique relying on matching file names may identify electronic data files with the same name as matching (or "duplicates") electronic data files, despite the fact that they have different contents, or may identify files with different names as non-matching files (e.g., not "duplicates") despite the fact that they have the same data contents. Thus, such techniques can generate false-positives that indicate non-matching electronic data files (e.g., files having different data contents) as duplicate electronic data files based on their having certain similar file characteristics, and/or can fail to identify matching electronic data files (e.g., files having the same data contents) as duplicate electronic data files based on their having certain dissimilar file characteristics.

Recognizing these and other shortcomings of existing techniques, Applicants have developed novel systems and methods for deduplication of electronic data files (such as oil and gas upstream electronic data files) using adaptive file digest. Embodiments include a multi-stage assessment that employs adaptive file digests to provide reliable identification of duplicate electronic data files in a relatively fast and efficient manner, in comparison to existing techniques. For example, embodiments can include first stages of processing that employ hash digests for relatively small samples of electronic data files to initially identify sets of potentially duplicate files, and subsequent processing that employs relatively large samples of electronic data files (e.g., the entire contents of electronic data files) to identify which if any of the sets of potentially duplicate files are indeed duplicates. This iterative approach can provide performance advantages by, for example, excluding non-duplicate electronic data files from certain levels of processing.

In some embodiments, for a set of electronic data files ("data files") in question, in a first stage of processing, a file size of each of the data files is determined and a relatively small first sample (e.g., 5-20 bytes) of the contents of each of the data files is extracted. The first sample of a data file can include, for example, bytes extracted at an even interval across the length of the data file. A first hashing function is applied to each of the first samples to generate a first hash digest for each of the data files, and these first hash digests are used in conjunction with file sizes of the respective data files to identify potentially duplicate and unique data files of the set of data files. For example, data files having a combination of a same matching data file size and a same first hash digest are grouped together to generate first groupings of potentially duplicate data files. Thus, each of the respective first groupings includes data files of the set of data files that are determined to have both of a same file size and a same first hash digest. Data files that have a file size that is unique from the file size of each of the other data files of the set of data files and/or a first hash digest that is unique from the first hash digest for each of the other data files of the set of data files can be identified as "unique" data files (e.g., data files that do not have a duplicate data file in the set of data files in question). Thus, the first stage of processing can identify at least some unique data files based on file sizes and first hash digests generated from processing of relatively small evenly-spaced first samples of the data files.

In some embodiments, in a second stage of processing, for each group of the first groupings of potentially duplicate data files, a relatively small second sample (e.g., 5-20 bytes) of the contents of each of the data files of the group is extracted. The second sample for each data file is different from the first sample for the data file and can include, for example, bytes extracted at an uneven interval (e.g., randomly) across the length of the data file. A second hashing function is applied to each of the second samples to generate a second hash digest for each of the data files in the group, and these second hash digests are used to identify potentially duplicate and unique data files of the group. For example, knowing the files in the group have the same file size, data files of the group having matching second hash digest are grouped together to generate second groupings of potentially duplicate data files of the group. Thus, each of the respective second groupings includes data files of the group determined to have the same second hash digest (as well as the same file size and the same first hash digest, based on the first stage of processing). Data files that have a unique second hash digest from the second hash digest of each of the other data files of the group can be identified as "unique" data files (e.g., data files that do not have a duplicate data file in the set of data files in question). Thus, the second stage of processing can identify at least some unique data files based on file sizes, first hash digests generated from processing of relatively small evenly-spaced first samples of the data files and second hash digests generated from processing of relatively small unevenly-spaced second samples of the data files.

In some embodiments, the second stage of processing can include repeating (e.g., repeating 1-5 times) the extraction and hashing of different relatively small samples. For example, a second round of the second stage of processing for a group of data files can include: for each data file of the group not determined to be unique by a prior round of the second stage of processing, extracting another relatively small second sample of the contents of each of the data files (e.g., another 5-20 bytes extracted at an uneven interval (e.g., randomly) across the length of the data file) that is different from the second sample(s) extracted in any prior round of the second stage of processing for the group; applying the second hashing function to the newly extracted relatively small second sample to generate a new set of second hash digests for the group of files; and comparing the new set of second hash digests to identify unique data files of the group and potentially matching sets of data files in the group. As a result of multiple rounds of processing in the second stage, each file not determined to be unique may be placed in a second grouping of other data files sharing the same file size, the same first hash digest, and the same multiple second hash digests generated in the second stage of processing for the group containing the file. Multiple rounds of hashing of relatively small samples in the second stage can further reduce the number of data files that are subjected to a more thorough assessment of subsequent stages of processing.

In some embodiments, in a third stage of processing, for each group of the second groupings of potentially duplicate data files, a relatively large third sample of the contents of each of the data files in the group is extracted. The third sample of a data file can include, for example, the entire contents of the data file. A third hashing function is applied to each of the third samples to generate a third hash digest for each of the data files in the group, and these third hash digests are used to identify potentially duplicate and unique data files of the group. For example, knowing the files in the group have the same file size, data files of the group having matching third hash digest are determined to be duplicate data files based on their having matching third hash digests (as well as the same file size, the same first hash digest and the same second hash digest(s), based on the first two stages of processing). Data files that have a unique third hash digest from the third hash digest of each of the other data files of the group can be identified as "unique" data files (e.g., data files that do not have a duplicate data file in the set of data files in question). Thus, the third stage of processing can identify at least some unique data files and duplicate data files based on a third stage of processing that is performed only on the potentially duplicate data files that remain after the first two stages of processing.

Thus, in some embodiments, first and second stages of processing involve assessing only relatively small portions of the contents of data files in an effort to identify potentially duplicate data files, and the process includes assessing a relatively large portion (e.g., the entirety) of the contents of only the data files not identified as unique (and thus still considered to have a potential duplicate) after the first two stages of processing. As a result, the processing overhead can be reduced as the first two stages of processing can quickly identify unique data files based on processing of relatively smalls sets of data. Moreover, only data files not identified as unique may be subjected to the more thorough processing that includes hashing of a relatively large portion (e.g., the entirety) of the contents of those data files.

Provided in some embodiments is an oil and gas upstream system including an oil and gas upstream facility adapted to generate upstream electronic data indicative of one or more characteristics of oil and gas upstream operations, and an oil and gas upstream data processing system. The oil and gas upstream data processing system adapted to identify a set of electronic data files including the upstream electronic data and, for each of the electronic data files of the set of electronic data files, extract a first sample of contents of the electronic data file (the first sample including less than entire contents of the electronic data file) and apply a first hash function to the first sample to generate a first hash digest for the electronic data file. The oil and gas upstream data processing system further adapted to group the set of electronic data files into first groupings (each group of the first groupings including electronic data files having a same file size and a same first hash digest) and, for each group of the first groupings and for each of the electronic data files in the group, extract a second sample of the contents of the electronic data file (the second sample of the electronic data file being different from the first sample of the electronic data file and including less than the entire contents of the electronic data file) and apply a second hash function to the second sample of the electronic data file to generate a second hash digest for the electronic data file. The oil and gas upstream data processing system further adapted to group the set of electronic data files into second groupings (each group of the second groupings including electronic data files having a same file size, a same first hash digest and a same second hash digest) and, for each group of the second groupings and for each of the electronic data files in the group, extract a third sample of the contents of the electronic data file (the third sample of the electronic data file including the entire contents of the electronic data file) and apply a third hash function to the third sample to generate a third hash digest for the electronic data file. The oil and gas upstream data processing system further adapted to determine sets of duplicate electronic data files of the set of electronic data files, where each set of duplicate electronic data files includes two or more electronic data files of the set of electronic data files having a same file size, a same first hash digest, a same second hash digest and a same third hash digest.

In some embodiments, the operations further include determining unique electronic data files of the set of electronic data files, each of the unique electronic data files including an electronic data file of the set of electronic data files that does not have a same file size, a same first hash digest, a same second hash digest and a same third hash digest as another electronic data file of the set of electronic data files.

In certain embodiments, extracting the first sample of contents of the electronic data file includes extracting bytes from the electronic data file at even intervals across a length of the electronic data file. In some embodiments, extracting the second sample of contents of the electronic data file includes extracting bytes from the electronic data file at random locations across a length of the electronic data file. In certain embodiments, extracting the first sample of the contents of the electronic data file includes extracting bytes from a first set of locations across a length of the electronic data file, the operations further include identifying a second set of locations that does not include any of the locations of the first set of locations, and extracting the second sample of contents of the electronic data file includes extracting bytes from the second set of locations such that the second sample does not include the bytes of any of the locations of the first set of locations.

In some embodiments, the operations further include, for each set of the sets of duplicate electronic data files, automatically removing all but one of the two or more electronic data files of the set. In certain embodiments, automatically removing all but one of the two or more electronic data files of a set includes inserting a link to the one of the two or more electronic data files not removed in place of each of the electronic data files of the set that is removed.

Provided in some embodiments is a method for assessing electronic data duplication. The method including: identifying a set of electronic data files and, for each of the electronic data files of the set of electronic data files, extracting a first sample of contents of the electronic data file (the first sample including less than entire contents of the electronic data file) and applying a first hash function to the first sample to generate a first hash digest for the electronic data file. The method further including grouping the set of electronic data files into first groupings (each group of the first groupings including electronic data files having a same file size and a same first hash digest) and, for each group of the first groupings and for each of the electronic data files in the group, extracting a second sample of the contents of the electronic data file (the second sample of the electronic data file being different from the first sample of the electronic data file and including less than the entire contents of the electronic data file) and applying a second hash function to the second sample of the electronic data file to generate a second hash digest for the electronic data file. The method further including grouping the set of electronic data files into second groupings (each group of the second groupings including electronic data files having a same file size, a same first hash digest and a same second hash digest) and, for each group of the second groupings and for each of the electronic data files in the group, extracting a third sample of the contents of the electronic data file (the third sample of the electronic data file including the entire contents of the electronic data file) and applying a third hash function to the third sample to generate a third hash digest for the electronic data file. The method further including determining sets of duplicate electronic data files of the set of electronic data files, where each set of duplicate electronic data files includes two or more electronic data files of the set of electronic data files having a same file size, a same first hash digest, a same second hash digest and a same third hash digest.

In some embodiments, the method further includes determining unique electronic data files of the set of electronic data files, each of the unique electronic data files including an electronic data file of the set of electronic data files that does not have a same file size, a same first hash digest, a same second hash digest and a same third hash digest as another electronic data file of the set of electronic data files.

In certain embodiments, extracting the first sample of contents of the electronic data file includes extracting bytes from the electronic data file at even intervals across a length of the electronic data file. In some embodiments, extracting the second sample of contents of the electronic data file includes extracting bytes from the electronic data file at random locations across a length of the electronic data file. In certain embodiments, extracting the first sample of the contents of the electronic data file includes extracting bytes from a first set of locations across a length of the electronic data file, the method further includes identifying a second set of locations that does not include any of the locations of the first set of locations, and extracting the second sample of contents of the electronic data file includes extracting bytes from the second set of locations such that the second sample does not include the bytes of any of the locations of the first set of locations.

In some embodiments, the method further includes, for each set of the sets of duplicate electronic data files, automatically removing all but one of the two or more electronic data files of the set. In certain embodiments, automatically removing all but one of the two or more electronic data files of a set includes inserting a link to the one of the two or more electronic data files not removed in place of each of the electronic data files of the set that is removed.

Provided in some embodiments is non-transitory computer readable storage medium including program instructions executable by a computer processor to cause the operations of the methods for assessing electronic data duplication described above.

Although certain embodiments are described in the context of processing electronic data in an oil and gas upstream environment for the purpose of illustration, the embodiments described herein can be employed an any number of suitable environments. For example, similar techniques can be employed for processing of electronic data in the midstream and downstream oil and gas data processing, as well as any industry in which the identification and/or removal of duplicate data files is desired.

Figure 1:
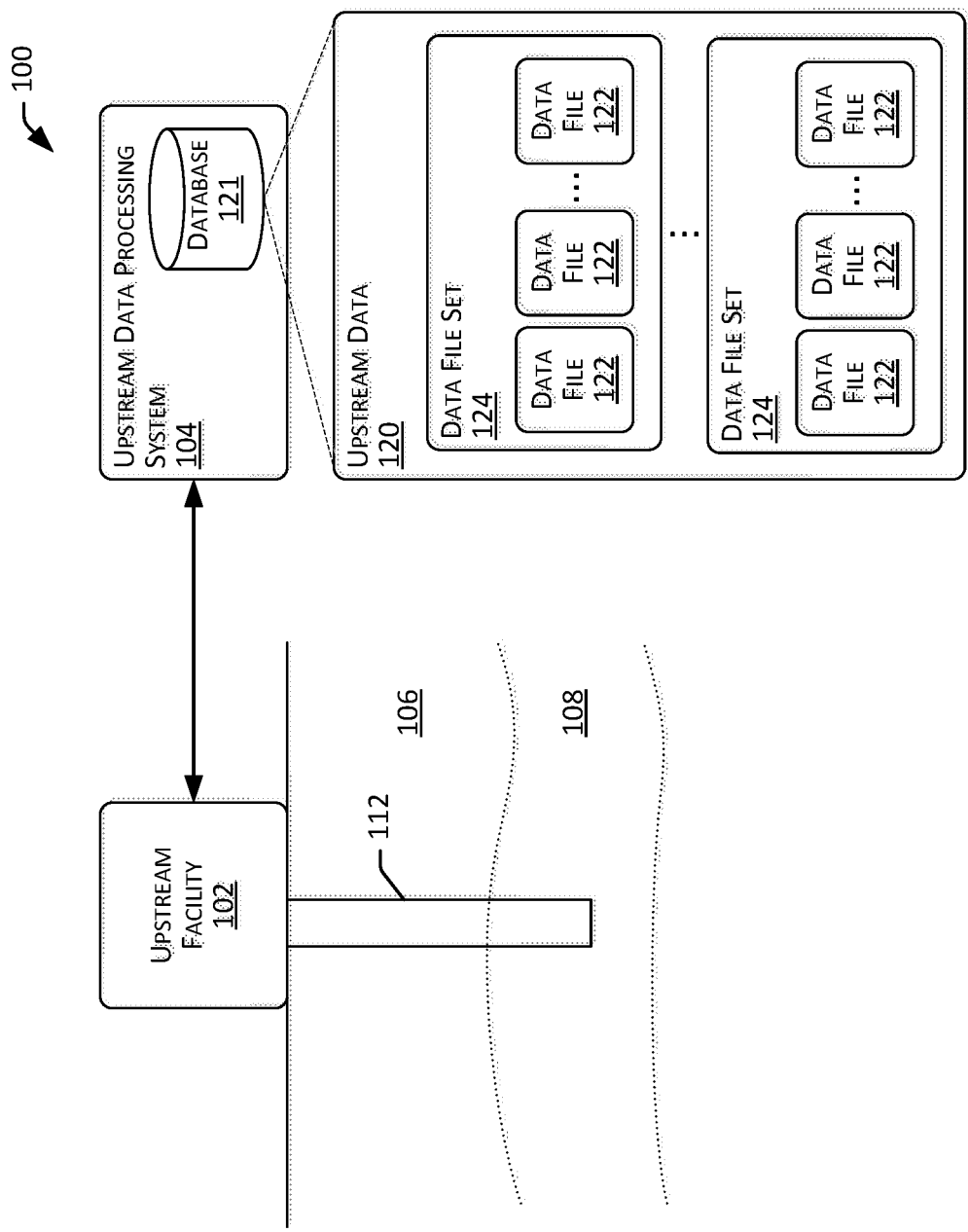
FIG. 1 is a diagram that illustrates an example oil and gas upstream data processing environment in accordance with one or more embodiments.

While this disclosure is susceptible to various modifications and alternative forms, specific embodiments thereof are shown by way of example in the drawings and will be described in detail herein. The drawings may not be to scale. It should be understood, however, that the drawings and the detailed descriptions thereto are not intended to limit the disclosure to the particular form disclosed, but, to the contrary, the intention is to cover all modifications, equivalents, and alternatives falling within the spirit and scope of the present disclosure as defined by the appended claims.

DETAILED DESCRIPTION

The present invention will now be described more fully hereinafter with reference to the accompanying drawings in which example embodiments of the invention are shown. This invention may, however, be embodied in many different forms and should not be construed as limited to the illustrated embodiments set forth herein, rather, these example embodiments are provided so that this disclosure will be thorough and complete, and will fully convey the scope of the invention to those skilled in the art.

Described herein are systems and methods for deduplication of electronic data files (such as oil and gas upstream electronic data files) using adaptive file digest. Embodiments include a multi-stage assessment that employs adaptive file digests to provide reliable identification of duplicate electronic data files in a relatively fast and efficient manner, in comparison to existing techniques. For example, embodiments can include first stages of processing that employ hash digests for relatively small samples of electronic data files to initially identify sets of potentially duplicate files, and subsequent processing that employs relatively large samples of electronic data files (e.g., the entire contents of electronic data files) to identify which if any of the sets of potentially duplicate files are indeed duplicates. This iterative approach can provide performance advantages by, for example, excluding non-duplicate electronic data files from certain levels of processing.

In some embodiments, for a set of electronic data files ("data files") in question, in a first stage of processing, a file size of each of the data files is determined and a relatively small first sample (e.g., 5-20 bytes) of the contents of each of the data files is extracted. The first sample of a data file can include, for example, bytes extracted at an even interval across the length of the data file. A first hashing function is applied to each of the first samples to generate a first hash digest for each of the data files, and these first hash digests are used in conjunction with file sizes of the respective data files to identify potentially duplicate and unique data files of the set of data files. For example, data files having a combination of a same matching data file size and a same first hash digest are grouped together to generate first groupings of potentially duplicate data files. Thus, each of the respective first groupings includes data files of the set of data files that are determined to have both of a same file size and a same first hash digest. Data files that have a file size that is unique from the file size of each of the other data files of the set of data files and/or a first hash digest that is unique from the first hash digest for each of the other data files of the set of data files can be identified as "unique" data files (e.g., data files that do not have a duplicate data file in the set of data files in question). Thus, the first stage of processing can identify at least some unique data files based on file sizes and first hash digests generated from processing of relatively small evenly-spaced first samples of the data files.

In some embodiments, in a second stage of processing, for each group of the first groupings of potentially duplicate data files, a relatively small second sample (e.g., 5-20 bytes) of the contents of each of the data files of the group is extracted. The second sample for each data file is different from the first sample for the data file and can include, for example, bytes extracted at an uneven interval (e.g., randomly) across the length of the data file. A second hashing function is applied to each of the second samples to generate a second hash digest for each of the data files in the group, and these second hash digests are used to identify potentially duplicate and unique data files of the group. For example, knowing the files in the group have the same file size, data files of the group having matching second hash digest are grouped together to generate second groupings of potentially duplicate data files of the group. Thus, each of the respective second groupings includes data files of the group determined to have the same second hash digest (as well as the same file size and the same first hash digest, based on the first stage of processing). Data files that have a unique second hash digest from the second hash digest of each of the other data files of the group can be identified as "unique" data files (e.g., data files that do not have a duplicate data file in the set of data files in question). Thus, the second stage of processing can identify at least some unique data files based on file sizes, first hash digests generated from processing of relatively small evenly-spaced first samples of the data files and second hash digests generated from processing of relatively small unevenly-spaced second samples of the data files.

In some embodiments, the second stage of processing can include repeating (e.g., repeating 1-5 times) the extraction and hashing of different relatively small samples. For example, a second round of the second stage of processing for a group of data files can include: for each data file of the group not determined to be unique by a prior round of the second stage of processing, extracting another relatively small second sample of the contents of each of the data files (e.g., another 5-20 bytes extracted at an uneven interval (e.g., randomly) across the length of the data file) that is different from the second sample(s) extracted in any prior round of the second stage of processing for the group; applying the second hashing function to the newly extracted relatively small second sample to generate a new set of second hash digests for the group of files; and comparing the new set of second hash digests to identify unique data files of the group and potentially matching sets of data files in the group. As a result of multiple rounds of processing in the second stage, each file not determined to be unique may be placed in a second grouping of other data files sharing the same file size, the same first hash digest, and the same multiple second hash digests generated in the second stage of processing for the group containing the file. Multiple rounds of hashing of relatively small samples in the second stage can further reduce the number of data files that are subjected to a more thorough assessment of subsequent stages of processing.

In some embodiments, in a third stage of processing, for each group of the second groupings of potentially duplicate data files, a relatively large third sample of the contents of each of the data files in the group is extracted. The third sample of a data file can include, for example, the entire contents of the data file. A third hashing function is applied to each of the third samples to generate a third hash digest for each of the data files in the group, and these third hash digests are used to identify potentially duplicate and unique data files of the group. For example, knowing the files in the group have the same file size, data files of the group having matching third hash digest are determined to be duplicate data files based on their having matching third hash digests (as well as the same file size, the same first hash digest and the same second hash digest(s), based on the first two stages of processing). Data files that have a unique third hash digest from the third hash digest of each of the other data files of the group can be identified as "unique" data files (e.g., data files that do not have a duplicate data file in the set of data files in question). Thus, the third stage of processing can identify at least some unique data files and duplicate data files based on a third stage of processing that is performed only on the potentially duplicate data files that remain after the first two stages of processing.

Thus, in some embodiments, first and second stages of processing involve assessing only relatively small portions of the contents of data files in an effort to identify potentially duplicate data files, and the process includes assessing a relatively large portion (e.g., the entirety) of the contents of only the data files not identified as unique (and thus still considered to have a potential duplicate) after the first two stages of processing. As a result, the processing overhead can be reduced as the first two stages of processing can quickly identify unique data files based on processing of relatively smalls sets of data. Moreover, only data files not identified as unique may be subjected to the more thorough processing that includes hashing of a relatively large portion (e.g., the entirety) of the contents of those data files.

Although certain embodiments are described in the context of processing electronic data in an oil and gas upstream environment for the purpose of illustration, the embodiments described herein can be employed an any number of suitable environments. For example, similar techniques can be employed for processing of electronic data in the midstream and downstream oil and gas data processing, as well as any industry in which the identification and/or removal of duplicate data files is desired.

FIG. 1 is a diagram that illustrates an example oil and gas upstream data processing environment ("environment") 100 in accordance with one or more embodiments. As illustrated, the environment 100 can include an oil and gas upstream facility ("upstream facility") 102 and an oil and gas upstream data processing system ("upstream data processing system" or "UDP system") 104.

The upstream facility 102 can include, for example, a facility for performing one or more operations for assessing a sub-surface formation 106, including a hydrocarbon reservoir 108. In some embodiments, the upstream facility 102 can provide for operating and/or assessing a well 112 drilled into the formation 106. The well 112 can include, for example, a production well operated to extract hydrocarbons from the reservoir 108, a monitoring well operated to monitor the formation 106 and/or the reservoir 108, and/or an injection well operated to inject substances into the formation 106 and/or the reservoir 108 to stimulate or otherwise enhance hydrocarbon production from the reservoir 108. In some embodiments, the upstream facility 102 includes surface components for assessing various characteristics of the formation 106, the reservoir 108 and/or the well 112. For example, the upstream facility 102 can include one or more seismic sources configured to generate sounds waves that are introduced into the formation 106 and one or more seismic sensors configured to sense reflections of the sounds waves. In such an embodiment, the upstream facility 102 may generate corresponding seismic data that is indicative of the reflections sensed by the seismic sensors. In some embodiments, the upstream facility 102 includes sub-surface components for assessing various characteristics of the formation 106, the reservoir 108 and/or the well 112. For example, the upstream facility 102 can include one or more down-hole logging tools configured to be lowered into (or otherwise disposed in) a borehole of the well 112 to obtain in-situ measurements of the borehole and/or the surrounding portions of the formation 106 and/or the reservoir 108. In such an embodiment, the upstream facility 102 may generate corresponding log data (e.g., well logs) that are indicative of the in-situ measurements. This can include, for example, electrical logs, porosity logs, lithology logs, nuclear magnetic resonance (NMR) logs and/or the like. In some embodiments, the upstream facility 102 includes components for assessing various production characteristics of the well 112. For example, the upstream facility 102 can include one or more pressure sensors, one or more temperature sensors, one or more flow rate sensors and/or the like for sensing respective production characteristics (e.g., pressure, temperature, flow rate and/or the like) of a stream of hydrocarbons other substances produced from (or otherwise present) in the well 112. In such an embodiment, the upstream facility 102 may generate corresponding production data that is indicative of the sensed production characteristics. This can include, for example, a production log and/or the like.

In some embodiments, the UDP system 104 may store and process upstream data 120. In some embodiments, the upstream data 120 is stored in an electronic database 121 (or similar electronic data store) of the UDP system 104. The upstream data 120 can include electronic data obtained from a variety of different sources, such as data from one or more upstream facilities (e.g., data from the upstream facility 102), data entered by employees of an oil and gas upstream organization, and/or the like. In some embodiments, the upstream data 120 can include one or more electronic data files ("data files") 122. The data files 122 can each include an electronic data record composed of multiple bytes of data. A data file 122 can include, for example, an electronic seismic data file that includes bytes of data corresponding to seismic data obtained by the UDP system 104 from the upstream facility 102, an electronic well log data file that includes bytes of data corresponding to log data obtained by the UDP system 104 from the upstream facility 102, an electronic production log data file that includes bytes of data corresponding to production data obtained by the UDP system 104 from the upstream facility 102, and/or the like. In some embodiments, the UDP system 104 can include a computer system that is the same or similar to computer system 1000 described with regard to at least FIG. 4.

In some embodiments, the data files 122 can be organized into (or contained in) one or more data file sets (or "sets of data files") 124. In some embodiments, a set of data files 124 can be associated with one or more projects. For example, a first set of data files 124 can include data files 122 stored in a first electronic file folder associated with a first project relating to monitoring a production of the well 112, a second set of data files 124 can include data files 122 stored in a second electronic file folder associated with a second project relating to monitoring in-situ characteristics of the well 112, and/or the like.

In some embodiments, the upstream data 120 is processed to identify and/or remove duplicate data. For example, the UDP system 104 can conduct a deduplication operation to identify duplicate data files 122 of the upstream data 120 (e.g., to identify data files 122 of the upstream data 120 that have contents that are the same as the contents of one or more other data files 122 of the upstream data 120) and, in some cases, remove at least some or all of the contents of the duplicate data files 122. This can be done, for example, to reduce the storage overhead required to maintain the upstream data 120 and/or to reduce processing overhead associated with processing of the upstream data 120.

Figure 2A:
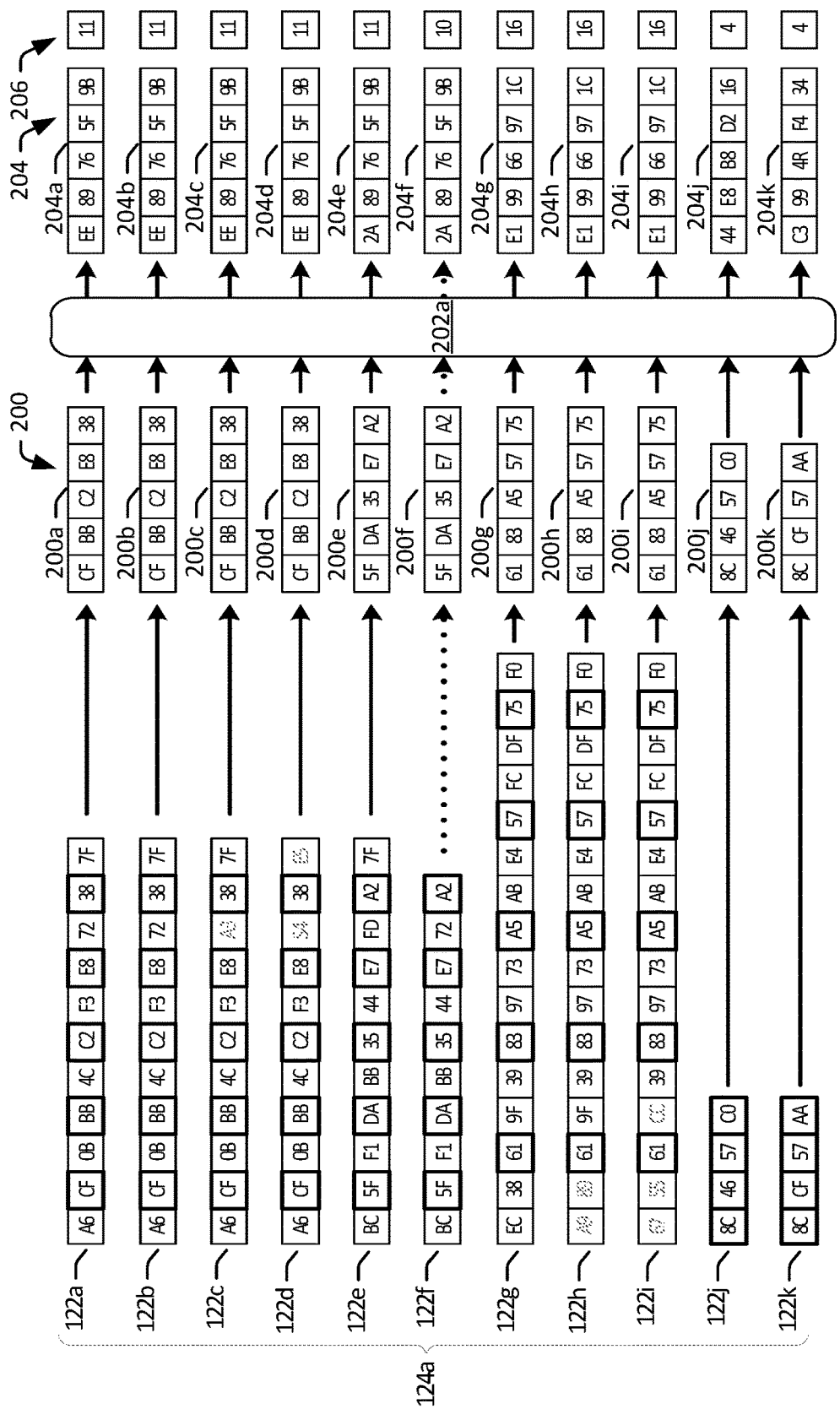
FIGS. 2A-2C are diagrams that illustrate an example multi-stage deduplication process employing adaptive file digest in accordance with one or more embodiments.
Figure 2B:
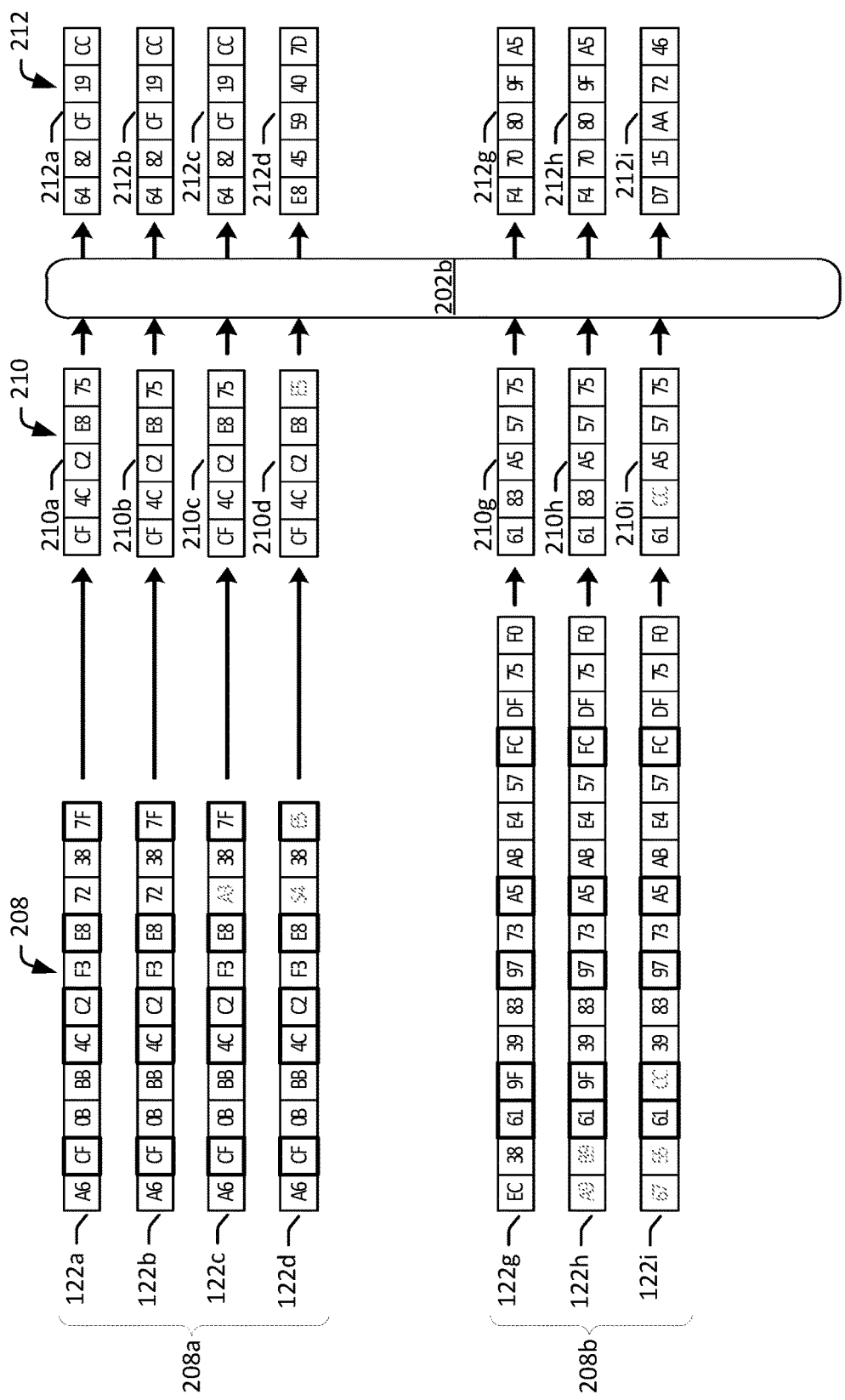
Figure 2C:
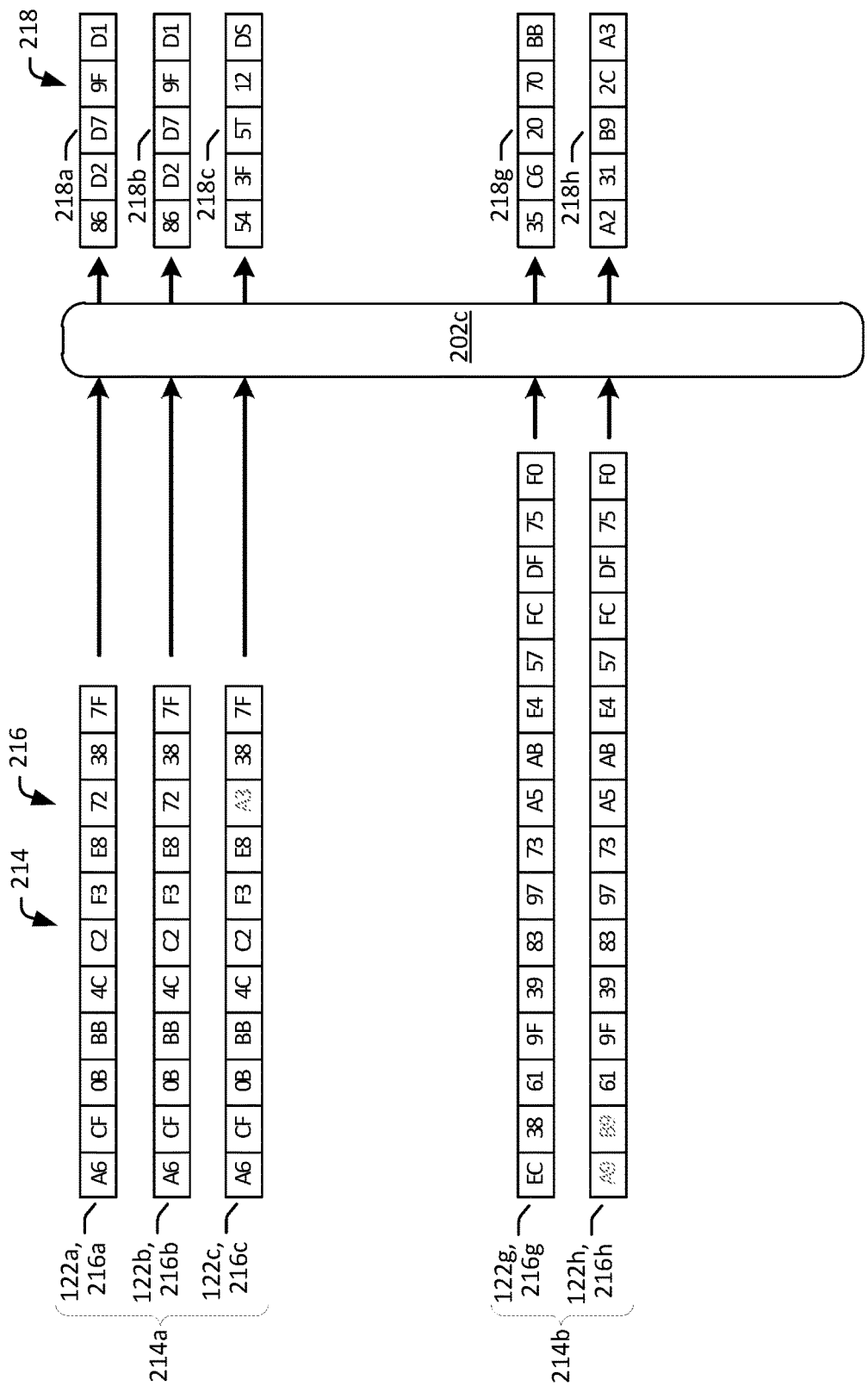

In some embodiments, a multi-stage deduplication process is employed that uses adaptive file digest to provide for reliable identification and/or remediation of duplicate ones of the electronic data files 122 in a relatively fast and efficient manner in comparison to existing techniques. FIGS. 2A-2C are diagrams that illustrate an example multi-stage deduplication process employing adaptive file digest in accordance with one or more embodiments.

FIG. 2A is a diagram that illustrates an example set of electronic data files 124a, including multiple data files 122 (e.g., data files 122a-122k). Each of the data files 122a-122k includes a respective set of bytes (represented in the individual blocks) that make up the contents of the data file 122. For example, data files 122a-122e are each composed of 11 bytes, data file 122f is composed of 10 bytes, data files 122g-122i are composed of 16 bytes, and data files 122j and 122k are each composed of 4 bytes.

In some embodiments, in a first stage of processing, the file size of each of the data files 122 of a set of data files 124 is determined, and a relatively small first sample (e.g., 5-20 bytes) of the contents of each of the data files 122 of the set of data files 124 is extracted to generate a corresponding set of first samples of the data files 122 of the set of data files 124. For example, the file sizes 206 of each of the data files 122a-122k can be determined, and a relatively small first sample (e.g., 5-20 bytes) of the contents of each of the data files 122a-122k can be extracted to generate a corresponding set of first samples 200 including first samples 200a-200k of the respective data files 122a-122k. Referring to FIG. 2A, for example, the first samples 200a-200i can include bytes extracted at an even interval across the length of the respective data files 122a-122i, and the first samples 200j and 200k can include all of the bytes of the respective data files 122j and 122k.

In some embodiments, the first sample of a data file 122 includes a given number of bytes (N1) of the data file 122 extracted at an even interval (I) across a length (L) of the data file 122. The interval (I) for a data file 122 may be a length (L) of the content of the file 122 divided by the number of bytes to be sampled (N1) (e.g., I=L/N1). In some embodiments, if the length (L) of the contents of a data file 122 is less than the number of bytes (N1), then the sample of that data file 122 may include all of the contents of the data file 122. Thus, for example, if the number of bytes to be sampled (N1) is 20 bytes and a first data file 122 has a length (L) of 100 bytes, then the interval (I) for the first data file 122 is 5 (e.g., I=L/N1=100/20=5). In such a case, the first sample of the first data file 122 can include bytes #5, 10, 15, . . . , 95 and 100. If a second data file 122 has a length (L) of 1024 bytes, for example, then the interval (I) for the second data file 122 is 51 (e.g., I=1024/20=51.2, rounded down to 51—the integer below 51.2). In such a case, the first sample of the second data file 122 can include bytes #51, 102, 153, . . . , 969 and 1020. If a third data file 122 has a length (L) of 10 bytes (e.g., L<N1), for example, then the first sample of the third data file 122 can include the entire contents of the third file 122 (e.g., bytes #1-10). In some embodiments, the given number of bytes (N1) of the data file 122 are extracted from locations across a length (L) of the data file 122. For example, the given number of bytes (N1) may be at least 5 such that the a byte is extracted from each quadrant of the data file 122 (e.g., at least one byte extracted from each of the first 25% of the bytes of the data file 122, the second 25% of the bytes of the data file 122, the third 25% of the bytes of the data file 122, and the fourth 25% of the bytes of the data file 122). In some embodiments, the given number of bytes (N1) may be at or below a threshold value (e.g., 20 bytes) in an effort to keep the size of the first sample relatively small and, in turn, keep the processing requirements relatively low. For example, the given number of bytes (N1) may be 15 bytes.

In some embodiments, a hashing function is applied to the first samples to generate corresponding first hash digests. For example, a first hashing function 202a can be applied to each of the first samples 200a-200k to generate the set of first hash digests 204 including first hash digests 204a-204k for the respective data files 122a-122k. In some embodiments, the first hashing 202a function includes a cryptographic hashing function.

In some embodiments, the first hash digests are used in conjunction with file sizes of the data files 122 of the set of data files 124 to identify and group potentially duplicate and unique data files 122 of the set of data files 124. For example, each of the data files 122a-122k having a combination of a same file size and a same first hash digest can be grouped together to generate first groupings 208 of potentially duplicate data files 122. Referring to FIGS. 2A and 2B, data files 122a-122d can be grouped together in a first group 208a of the first groupings 208, and data files 122g-122i can be grouped together in a second group 208b of the first groupings 208. Thus, each of the respective first groupings 208 includes data files 122 of the set of data files 124a determined to have both of a same file size and a same first hash digest.

Data files 122 of the set of data files 124 that have a combination of file size and first hash digest that is unique from the combination of file size and first hash digest for each of the other data files 122 of the set of data files can be identified as unique data files (e.g., data files 122 that do not have a duplicate data file 122 in the set of data files 124). For example, data files 122e, 122f, 122j and 122k can be identified as unique data files 122 of the set of data files 124a. In some embodiments, a data file 122 flagged as unique in the first stage of processing is not subjected to subsequent stages of processing. For example, the UDP system 104 may exclude the data files 122e, 122f, 122j and 122*k* (flagged as unique in the first stage of processing) from a second stage of processing that includes extracting and hashing of second samples of data files and/or a third stage of processing that includes extracting and hashing of third samples (e.g., the entire contents) of data files.

In some embodiments, if a data file 122 does not have the same size as any of the other data files 122 in the set of data files 124, it can be determined to be unique within the set of data files 124, and may not be subjected to processing beyond the determination of the file size of the data file 122. For example, in response to determining that the data file 122*f* has a file size of 10 bytes and that none of the other data files 122 of the set of data files 124*a* has a file size of 10 bytes, it can be determined that the data file 122*f* is unique from the other data files 122 of the set of data files 124*a* based on the file size alone, without additional processing (e.g., without extracting the first sample 200*f* from the data file 122*f*, hashing the first sample 200*f* and/or comparing the first hash digests 204f to the first samples and first hash digests 204 for the other data files 122).

In some embodiments, in a second stage of processing, for each group of the first groupings, a relatively small second sample (e.g., 5-20 bytes) of the contents of each of the data files 122 of the group is extracted to generate a corresponding set of second samples for the data files 122 of the group. For example, for the first group 208*a*, a relatively small second sample (e.g., 5-20 bytes) of the contents of each of the data files 122*a*-122*d* can be extracted to generate respective second samples 210*a*-210*d* of a set of second samples 210. For the second group 208*b*, a relatively small second sample (e.g., 5-20 bytes) of the contents of each of the data files 122*g*-122*i* can be extracted to generate respective second samples 210*g*-210*i* of the set of second samples 210.

In some embodiments, the second sample of a data file 122 is different from the first sample of the data file 122. The second sample of a data file 122 can include, for example, bytes extracted at an uneven interval (e.g., a random interval) across the length of the contents of the data file 122. In some embodiments, the bytes of the second sample are extracted from the bytes not extracted to generate the first sample. For example, referring to the above example in which the first sample of the first data file 122 includes bytes #5, 10, 15, . . . , 95 and 100 of the data file 122, the second sample may include a sampling of the other bytes of the data file 122 (e.g., bytes #1, 2, 3, 4, 6, 7, 8, 9, 11, . . . , 96, 97, 98 and 99 of the data file 122). Such a different sampling may further enhance the speed and accuracy of the technique as a whole by not sampling and/or hashing bytes that are already known to be the same based on the results of the hashing operation in the first stage of processing. In some embodiments, the second samples of the data files 122 in a group includes bytes that are extracted from the same location within each of the respective data files 122 of the group. Referring again to the above example, if for example, the second sample includes bytes #1, 4, 6 and 9, then the second sample of a first data file 122 of the group may include bytes #1, 4, 6 and 9 of the first data file 122, the second sample of a second data file 122 of the group may include bytes #1, 4, 6 and 9 of the second data file 122, and so forth. In some embodiments, a given number of bytes (N2) of the data file 122 extracted to generate the second sample is large enough to provide a representative sample of the data file 122. For example, the given number of bytes (N2) may be at least 5 bytes. In some embodiments, the given number of bytes (N2) may be at or below a threshold value (e.g., at or below 20 bytes) in an effort to keep the size of the second sample relatively small and, in turn, keep the processing requirements relatively low. For example, the given number of bytes (N2) may be 15 bytes. In some embodiments, the given number of bytes (N2) of the data file 122 are extracted from locations across a length (L) of the data file 122. For example, at least one byte may be selected at random and extracted from each of the first 25% of the bytes of the data file 122, the second 25% of the bytes of the data file 122, the third 25% of the bytes of the data file 122, and the fourth 25% of the bytes of the data file 122. As noted above, the byte selection process for a data file 122 may exclude the bytes extracted to generate the first sample for the data file 122.

Although certain embodiments are described that include extracting first samples that include a given number of bytes (N1) of the data file 122 extracted at an even interval (I) across a length (L) of the data files 122 (e.g., in the first stage of processing), and second samples that include bytes extracted at an uneven interval (e.g., randomly) across the length of the contents of the data files 122 (e.g., in the second stage of processing), in some embodiments, the first samples can include bytes extracted at an uneven interval (e.g., randomly) across the length of the contents of the data files 122 (e.g., in the first stage of processing), and the second samples can include a given number of bytes (N1) of the data files 122 extracted at an even interval (I) across a length (L) of the data files 122 (e.g., in the second stage of processing).

In some embodiments, a hashing function is applied to the second samples to generate second hash digests. For example, a second hashing function 202*b* can be applied to each of the second samples 210*a*-210*d* of the first group 208*a* to generate a set of second hash digests 212*a*-212*d* (of a set of second has digests 212) for the respective data files 122*a*-122*d* of the first group 208*a*, and the second hashing function 202*b* can be applied to each of the second samples 210*g*-210*i* of the second group 208*b* to generate a set of second hash digests 212*g*-212*i* (of the set of second has digests 212) for the respective data files 122*a*-122*d* of the second group 208*b*. In some embodiments, the second hashing function 202*b* includes a cryptographic hashing function. In some embodiments, the second hashing function 202*b* is the same as the first hashing function 202*a*. In some embodiments, the second hashing function 202*b* is different from the first hashing function 202*a*.

In some embodiments, the second hash digests 212 are used to identify and group potentially duplicate and unique data files 122 of the first groupings 208. This can generate second groupings of the data files 122 of the set of data files 124. Referring to FIGS. 2B and 2C, for example, data files 122*a*-122*c* (having matching second hash digests and file sizes) can be grouped together to generate a first group 214*a* of a set of second groupings 214, and data files 122*g* and 122*h* (having matching second hash digest and files size) can be grouped together to generate a second group 214*b* of the second groupings 214. Thus, each of the respective second groupings 214 can include data files 122 (of a particular group of the first groupings 208) that are determined to have the same second hash digest (as well as the same file size and the same first hash digest, based on the first stage of processing).

Data files 122 of a particular group of the first groupings that have a second hash digest that is unique from the second hash digests for the other data files 122 of the group can be identified as unique data files (e.g., data files 122 that do not have a duplicate data file 122 in the set of data files). For example, data file 122*d* can be identified as a unique data file 122 of the set of data files 124*a* based on the second hash digest 212*d* being different than the second hash digests 212*a*-212*c* for each of the other data files 122*a*-122*c* of the first group 208*a* of the first groupings 208. The data file 122*i* can be identified as a unique data file 122 of the set of data files 124*a* based on the second hash digest 212*i* being different than the second hash digest 212*g* and 212*h* for each of the other data files 122*g* and 122*h* of the second group 208*b* of the first groupings 208. In some embodiments, a data file 122 flagged as unique in the second stage of processing is not subjected to subsequent stages of processing. For example, the UDP system 104 may exclude data files 122*d* and 122*i* (flagged as unique in the second stage of processing) from a third stage of processing that includes extracting and hashing of third samples (e.g., the entire contents) of data files.

In some embodiments, the second stage of processing can include repeating (e.g., repeating 1-5 times) the extraction and hashing of different relatively small samples. For example, a second round of the second stage of processing for a group of data files can include: for each data file 122 of the group not determined to be unique by a prior round of the second stage of processing, extracting another relatively small second sample of the contents of each of the data files 122 (e.g., another 5-20 bytes extracted at an uneven interval (e.g., randomly) across the length of the data file 122) that is different from the second sample(s) 210 and the bytes extracted in any prior round of the second stage of processing for the group; applying the second hashing function to the newly extracted relatively small second sample to generate a new set of second hash digests for the group; and comparing the new set of second hash digests to identify unique data files 122 of the group and potentially matching sets of data files 122 in the group.

Referring to FIG. 2B, for example, the second stage of processing can further include repeating the extraction and hashing of additional relatively small second samples for the data files of the groups 208. For example, a second round of the second stage of processing for the first group 208*a* can include: for each of data files 122*a*, 122*b* and 122*c* of the first group 208*a* (not determined to be unique by the first round of the second stage of processing), extracting another (or "second") relatively small second sample of the contents of each of the data files 122*a*, 122*b* and 122*c* (e.g., another 5-20 bytes extracted at an uneven interval (e.g., a random interval) across the length of the data files 122*a*, 122*b* and 122*c*) that is different from the second sample(s) and the bytes extracted in any prior round of the second stage of processing for the group 208*a*; applying the second hashing function 202*b* to the newly extracted (second) relatively small second samples to generate a new set of second hash digests for the group 208*a*; and comparing the new (second) set of second hash digests to identify unique data files 122 of the group 208*a* and potentially matching sets of data files 122 in the group 208*a*. The second relatively small sample for the second round of the second stage of processing may include, for example, bytes #1, #3, #4, #7 and #9, which are selected at random from bytes across the length of the data files 122*a*, 122*b* and 122*c* from the bytes of the data files 122*a*, 122*b* and 122*c* that were not include in the second sample extracted in the first round of the second stage of processing of the group 208*a*. In such an embodiment, the data file 122*c* may be determined to be a unique data file of the set of data files 124*a* based on the second hash digest for the data file 122*c* generated as a result of the second round of the second stage of processing being different from the second hash digests for the data files 122*a* and 122*b* generated as a result of the second round of the second stage of processing. The data files 122*a* and 122*b* may be determined to potentially duplicate data files of the set of data files 124*a* based on the second hash digest for the data files 122*a* and 122*c* generated as a result of the second round of the second stage of processing being the same. As a result of the multiple rounds of processing in the second stage, the data files 122*a* and 122*c* may be placed in a second grouping 214 of data files sharing the same file size, the same first hash digest, and the same multiple (e.g., first and second) second hash digests generated in the second stage of processing for the group 208*a*, and the data file 122*c* may be excluded from the third stage of processing. Similar additional rounds of processing (e.g., $3^{rd}$, $4^{th}$, $5^{th}$ and so forth rounds of processing) can be provided in the second stage of processing.

If, for example, the group 208*a* had included a fifth data file 122 having the same the same file size, the same first hash digest, and the same multiple (e.g., first and second) second hash digests as the data file 122*c*, then second groupings based on the two rounds of the second stage of processing would have included a first-second grouping including data files 122*a* and 122*b* and a second-second grouping including data files 122*c* and the fifth data file 122. In such an embodiment, both of the second groupings (e.g., including data files 122*a* and 122*b* as well as 122*c* and the fifth data file 122) would be subject to the third stage of processing.

In some embodiments, in a third stage of processing, for each group of the second groupings, a relatively large third sample of the contents of each of the data files 122 of the group is extracted to generate a corresponding set of third samples for the data files 122 of the group. For example, for the first group 214*a* of the second groupings 214, a third sample of the contents of each of the data files 122*a*-122*c* can be extracted to generate respective third samples 216*a*-216*c* (of a set of third samples 216). For the second group 214*b* of the second groupings 214*b*, a third sample of the contents of each of the data files 122*g* and 122*h* can be extracted to generate respective third samples 216*g* and 216*h* (of the set of third samples 216). In some embodiments, the third sample of a data file 122 includes the entire contents of the data file 122. For example, where the data files 122 of a group each includes 20 bytes, the third sample may include bytes #1, 2, 3, . . . , 19 and 20. Referring to FIG. 2A, for example, each of the third samples 216*a*-216*c*, 216*g* and 216*h* can be comprised of the entire contents of the respective data files 122*a*-122*c*, 122*g* and 122*h*.

In some embodiments, a hashing function is applied to the third samples to generate third hash digests. For example, a third hashing function 202*c* can be applied to each of the third samples 216*a*-216*c* of the first group 214*a* to generate a set of third hash digests 218*a*-218*c* (of a set of third has digests 218) for the respective data files 122*a*-122*c* of the first group 214*a*, and the third hashing function 202*c* can be applied to each of the second samples 216*g* and 216*h* of the second group 214*b* to generate a set of third hash digests 218*g* and 218*h* (of a set of third has digests 218) for the respective data files 122*g* and 122*h* of the second group 214*b*. In some embodiments, the third hashing function 202*c* includes a cryptographic hashing function. In some embodiments, the third hashing function 202*c* is the same as the first hashing function 202*a* and/or the second hashing function 202*b*. In some embodiments, the third hashing function is different from the first hashing function 202*a* and/or the second hashing function 202*b*.

In some embodiments, the third hash digests are used to identify duplicate and unique data files 122 of the second groupings. For example, data files 122*a* and 122*b* can be determined to be duplicate data files based on their having matching third hash digests 218a and 218b. Data files 122 of a group of the second groupings 214 that have a third hash digest that is unique from the third hash digests for the other data files 122 of the group can be identified as unique data files (e.g., data files 122 that do not have a duplicate data file 122 in the set of data files 124a). For example, data file 122c can be identified as a unique data file 122 of the set of data files 124a based on the third hash digest 218c being different than each of the third hash digest 218a and 218b for the other data files 122a and 122b of the first group 214a of the second groupings 214. Similarly, the data files 122g and 122h can each be identified as unique data files 122 of the set of data files 124a based the third hash digests 218g and 218h being different from one another. In some embodiments, a listing of unique and/or duplicate data files 122 can be stored in the database, provided to another process for assessment and/or displayed to a user.

In some embodiments, remedial measures can be taken to account for duplicate data files. For example, if the UDP system 104 identifies two or more data files 122 as being duplicates, the UDP system 104 can automatically (e.g., without human intervention) remove (e.g., delete) all but one of the two or more data files 122, such that only a single copy of the duplicate files 122 remains. Such deduplication can decrease the storage overhead of the UDP system 104, especially in instances in which there are numerous and/or large duplicate data files 122 residing in the database 121 of the UDP system 104. In some embodiments, the UDP system 104 provides a link to the remaining data for a duplicate file 122. For example, if the UDP system 104 automatically deletes all but one of the two or more data files 122 such that only a single copy of the duplicate data files 122 remain, the UDP system 104 may automatically provide a pointer in place of the deleted file(s) 122 that links back to the single remaining copy of the data file 122. In the event one an attempt is made to access one of the deleted data files 122, the pointer may redirect the requesting process or entity to the location of the remaining data file 122. Thus, such a pointer may prevent broken links that could otherwise occur if data files 122 are removed without notifying a process or entity relying on those data files 122.

In some embodiments, the identification of duplicate files can be used to determine a similarity between two or more sets of data files 124. For example, if a first set of data files 124 (e.g., a first project folder) includes a first set of data files 122, and a second set of data files 124 (e.g., a second project folder) includes a second set of data files 122, the UDP system 104 can subject the first and second sets of data files 124 to the above described deduplication process to identify duplicate data files 122 (e.g., data files 122 that reside in both of the two project folders), and the presence of duplicate files in each of the sets of data files 124 can be used to determine a similarity of the two folders. For example, if the first set of data files 124 contains 1000 data files 122 and the second set of data files 124 contains 3000 data files 122, and there are 40 duplicate data files 122 between the two sets of data files 124 (e.g., 40 data files 122 in both of the first folder and the second folder), a similarity value of 1% (e.g., 40/4000) can be determined for the two folders. A similar deduplication can be performed between any number of folders (or similar locations) to determine a level of similarity there between. Such a similarity value can be especially useful in the context of oil and gas upstream data to identify different projects that rely on similar data, and thus may benefit from a consolidation of data and/or efforts. For example, if the UDP system 104 determines that a similarity value for two folders exceeds a threshold similarity value (e.g., 10%), the UDP system 104 may send a corresponding alert to the entities (e.g., to the employees) responsible for management of each of the sets of data files 124. Thus, entities may be made aware of a cross-over in efforts, which may not have been discovered otherwise, and can consult with one another to determine whether it is in the best interest of the organization to consolidate some of their efforts, and, at the least, consolidate the duplicate data files 122 identified for the respective sets of data files 124.

Thus, in some embodiments, first and second stages of processing involve assessing only relatively small portions of the contents of data files in an effort to identify potentially duplicate data files 122 of a set of data files 124, and the process includes assessing a relatively large portion (e.g., the entirety) of the contents of only the data files 122 not identified as unique (and thus still considered to have a potential duplicate) after the first two stages of processing. As a result, the processing overhead can be reduced as the first two stages of processing can quickly identify unique data files 122 based on processing of relatively smalls sets of data. Moreover, only data files 122 not identified as unique may be subjected to the more thorough processing that includes hashing of a relatively large portion (e.g., the entirety) of the contents of those data files.

Figure 3:
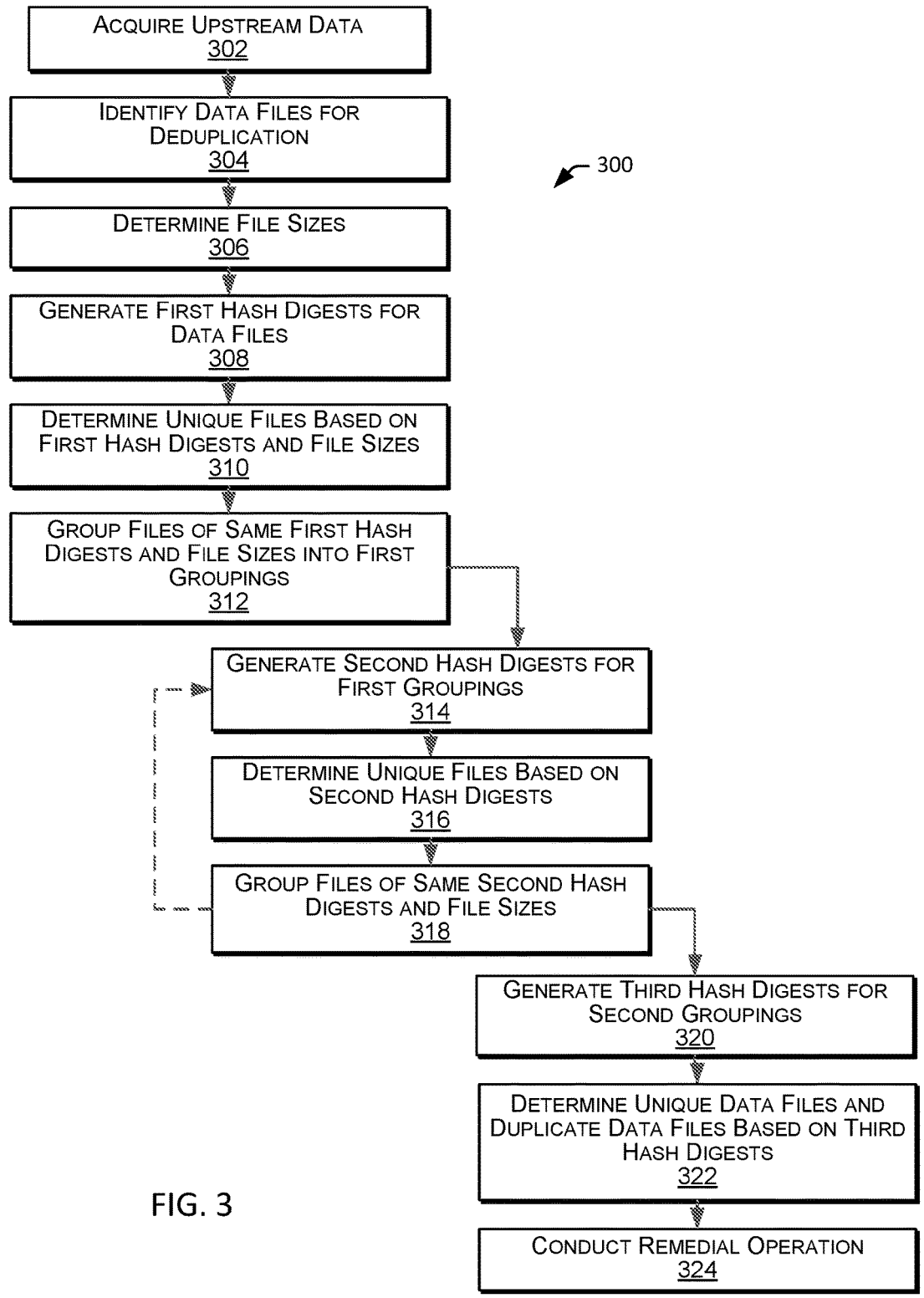
FIG. 3 is a flowchart diagram that illustrates an example method of multi-stage deduplication in accordance with one or more embodiments.

In some embodiments, such a multi-stage deduplication process is executed by the UDP system 104 to provide for reliable identification of duplicate electronic data files 122 in some or all of the upstream data 120. FIG. 3 is a flowchart diagram that illustrates an example method of multi-stage deduplication 300 in accordance with one or more embodiments.

In some embodiments, method 300 includes acquiring upstream data (block 302). Acquiring upstream data can include the UDP system 104 acquiring some or all of the upstream data 120 from a variety of different sources, such as one or more upstream facilities, data entered by employees of an oil and gas upstream organization, and/or the like. For example, the upstream facility 102 may conduct one or more operations (e.g., a seismic operation, a logging operation, a production operation, and/or the like) and generate corresponding upstream data 120 (e.g., seismic data, well log data, production data and/or the like) that is provided to the UDP system 104, and the UDP system 104 may store the upstream data 120 as data files 122 in the database 121. In some embodiments, the UDP system 104 may organize the data files 122 into data file sets 124, such as different project folders.

In some embodiments, method 300 includes identifying data files for deduplication (block 304). Identifying data files for deduplication can include the UDP system 104 identifying some or all of the data files 122 of the upstream data for consideration in a deduplication process. For example, identifying data files for deduplication can include the UDP system 104 identifying the set of data files 124a from one or more data file sets 124 (as described above with regard to at least FIG. 2A). If for example, two sets of data files 124 (e.g., two project folders) are being compared to determine a similarity there between, identifying data files for deduplication can include the UDP system 104 identifying data files 122 of two sets of data files 124.

In some embodiments, method 300 includes determining file sizes (block 306). In some embodiments, determining file sizes includes the UDP system 104 determining the file size (or "length") of each of the data files 122 of the set of data files in question. For example, determining file sizes can include the UDP system 104 determining the size of each of the data files 122 of the set of data files 124*a* (as described above with regard to at least FIG. 2A).

In some embodiments, method 300 includes generating first hash digests for the data files (block 308). Generating first hash digests for the data files can include the UDP system 104 extracting first samples from each of the data files 122 of the set of data files in question and hashing the first samples to generate first hash digests for each of the data files 122 of the set of data files in question. For example, generating first hash digests for the data files can include the UDP system 104 extracting first samples 200*a*-200*k* from each of the data files 122*a*-122*k* of the set of data files 124*a*, and generating the first hash digests 204*a*-204*k* (as described above with regard to at least FIG. 2A).

In some embodiments, method 300 includes determining unique data files based on the first hash digests (block 310). Determining unique data files based on the first hash digests can include the UDP system 104 determining unique data files 122 of the set of data files in question based on the first hash digests determined for the data files 122. For example, determining unique data files based on the first hash digests can include the UDP system 104 determining that data files 122*e*, 122*f*, 122*j* and 122*k* are unique data files 122 of the set of data files 124*a* (as described above with regard to at least FIG. 2A). In some embodiments, unique data files 122 can be determined based on a unique file size (as described above with regard to at least data file 122*f* and FIG. 2A).

In some embodiments, method 300 includes grouping files of the same first hash digests and file sizes into first groupings (block 312). Grouping files of the same first hash digests and file sizes into first groupings can include the UDP system 104 grouping data files 122 having matching first hash digests and file sizes into respective first groupings of the data files 122. For example, grouping files of the same first hash digests and file sizes into first groupings can include the UDP system 104 grouping data files 122*a*-122*d* together in the first group 208*a* of the first groupings 208, and grouping data files 122*g*-122*i* together in the second group 208*b* of the first groupings 208 (as described above with regard to at least FIGS. 2A-2B).

In some embodiments, method 300 includes generating second hash digests for the first groupings (block 314). Generating first hash digests for the first groupings can include the UDP system 104 extracting second samples from each of the data files 122 of the first groupings and hashing the second samples to generate second hash digests for the data files 122 of the first groupings. For example, generating second hash digests for the first groupings can include the UDP system 104 extracting second samples 210*a*-210*d* and 210*g*-210*i* from the data files 122*a*-122*d* and 122*g*-122*i* of the first groupings 208, and generating the second hash digests 212*a*-212*d* and 212*g*-212*i* (as described above with regard to at least FIG. 2B).

In some embodiments, method 300 includes determining unique data files based on the second hash digests (block 316). Determining unique data files based on the second hash digests can include the UDP system 104 determining unique data files 122 of the set of data files in question based on the second hash digests determined for the data files 122 of the first groupings. For example, determining unique data files based on the second hash digests can include the UDP system 104 determining that data files 122*d* and 122*i* are unique data files 122 of the set of data files 124*a* (as described above with regard to at least FIGS. 2B and 2C).

In some embodiments, method 300 includes grouping files of the same second hash digest and file size into second groupings (block 318). Grouping files of the same first hash digests and file sizes into second groupings can include the UDP system 104 grouping data files 122 having matching second hash digests and file sizes into respective second groupings of the data files 122. For example, grouping files of the same first hash digest and file size into second groupings can include the UDP system 104 grouping data files 122*a*-122*c* together in the first group 214*a* of the second groupings 214, and grouping data files 122*g* and 122*h* together in the second group 214*b* of the second groupings 214 (as described above with regard to at least FIGS. 2B and 2C).

As described, in some embodiments, the second stage of processing can include multiple iterations of generating second hash digests for the first groupings, determining unique data files based on multiple second hash digests and grouping files of the same second hash digests and files sizes. Such repeated iterations are represented by the dashed line extending from block 318 to block 314. For example, in a second round (or iteration) of the second stage of processing for the first group 208*a*, the step of generating second hash digests for the first groupings (block 314) can include, for each of data files 122*a*, 122*b* and 122*c* of the first group 208*a* (not determined to be unique by the first round of the second stage of processing), extracting another (or "second") relatively small second sample of the contents of each of the data files 122*a*, 122*b* and 122*c* (e.g., another 5-20 bytes extracted at an uneven interval (e.g., a random interval) across the length of the data files 122*a*, 122*b* and 122*c*) that is different from the second sample(s) and the bytes extracted in any prior round of the second stage of processing for the group 208*a*, and applying the second hashing function 202*b* to the newly extracted (second) relatively small second samples to generate a new set of second hash digests for the group 208*a*. In a second round (or iteration) of the second stage of processing for the first group 208*a*, determining unique data files based on the second hash digests (block 316) can include comparing the new (second) set of second hash digests to identify unique data files 122 of the group 208*a* and potentially matching sets of data files 122 in the group 208*a*. In such an embodiment, the data file 122*c* may be determined to be a unique data file 122 of the set of data files 124*a* based on the second hash digest for the data file 122*c* generated as a result of the second round of the second stage of processing being different from the second hash digests for the data files 122*a* and 122*b* generated as a result of the second round of the second stage of processing. The data files 122*a* and 122*b* may be determined to potentially duplicate data files of the set of data files 124*a* based on the second hash digest for the data files 122*a* and 122*c* generated as a result of the second round of the second stage of processing being the same. In a second round (or iteration) of the second stage of processing for the first group 208*a*, grouping files of the same second hash digest and file size into second groupings (block 318) can include grouping data files 122*a* and 122*c* in the second grouping 214*a* of data files 122 sharing the same file size, the same first hash digest, and the same multiple (e.g., first and second) second hash digests generated in the second stage of processing for the group 208*a*. In such an embodiment, the data file 122*c* may be determined to be a unique data file 122 of the set of data files 124*a* and, thus, may be excluded from subsequent processing (e.g., from the third stage of processing at blocks 320, 322 and/or 324).

In some embodiments, method 300 includes generating third hash digests for the second groupings (block 320). Generating third hash digests for the second groupings can include the UDP system 104 extracting third samples from each of the data files 122 of the second groupings and hashing the third samples to generate third hash digests for the data files 122 of the second groupings. For example, generating third hash digests for the second groupings can include the UDP system 104 hashing the entire contents of the data files 122*a*-122*c,* 122*g* and 122*h* of the second groupings 214 to generate the third hash digests 218*a*-212*c,* 218*g* and 218*h* (as described above with regard to at least FIG. 2C).

In some embodiments, method 300 includes determining unique data files and duplicate data files based on the third hash digests (block 322). Determining unique data files based on the third hash digests can include the UDP system 104 determining unique data files 122 of the set of data files in question based on the third hash digests determined for the data files 122 of the second groupings. For example, determining unique data files based on the third hash digests can include the UDP system 104 determining that data files 122*c,* 122*g* and 122*h* are unique data files 122 of the set of data files 124*a* (as described above with regard to at least FIG. 2C). Determining duplicate data files based on the third hash digests can include the UDP system 104 determining duplicate data files 122 of the set of data files in question based on the third hash digests determined for the data files 122 of the second groupings. For example, determining duplicate data files based on the third hash digests can include the UDP system 104 determining that data files 122*a* and 122*b* are duplicate data files (as described above with regard to at least FIG. 2C).

In some embodiments, method 300 includes conducting a remedial operation (block 324). Conducting a remedial operation can include the UDP system 104 conducting a remedial operation to account for the duplicate data files identified. For example, the UDP system 104 may store a listing of unique and/or duplicate data files 122 in the database 121 and/or provided the listing to another process for assessment and/or for display to a user, remove at least some of the two or more duplicate data files 122 (e.g., automatically remove all but one of the two or more data files 122, such that only a single copy of the duplicate files 122 remains), determine a similarity between two or more sets of data files 124 and/or the like, as described above.

Accordingly, provided in some embodiments is a multi-stage deduplication process that uses adaptive file digest to provide for reliable identification and/or remediation of duplicate electronic data files in a relatively fast and efficient manner in comparison to existing techniques. Although certain embodiments are described in the context of an oil and gas upstream data processing environment for the purpose of illustration, the embodiments described here can be employed an any number of suitable environments.

Figure 4:
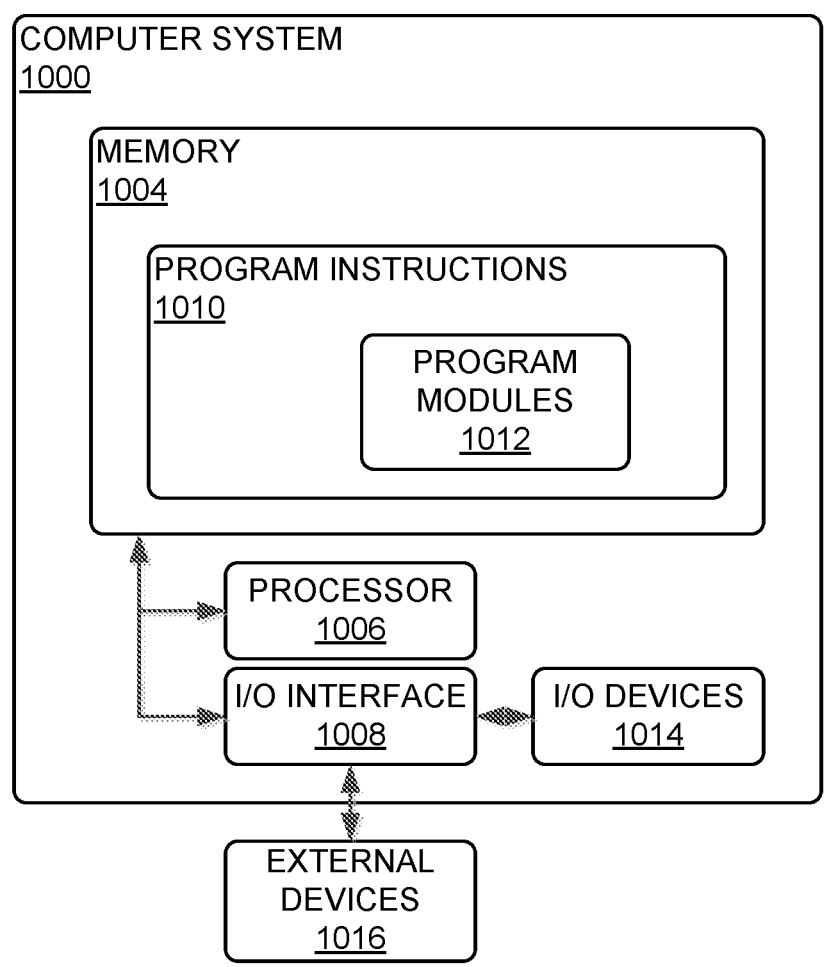
FIG. 4 is a diagram that illustrates an example computer system in accordance with one or more embodiments.

FIG. 4 is a diagram that illustrates an example computer system 1000 in accordance with one or more embodiments. In some embodiments, the computer system 1000 includes a memory 1004, a processor 1006, and/or an input/output (I/O) interface 1008. The memory 1004 can include non-volatile memory (e.g., flash memory, read-only memory (ROM), programmable read-only memory (PROM), erasable programmable read-only memory (EPROM), electrically erasable programmable read-only memory (EEPROM)), volatile memory (e.g., random access memory (RAM), static random access memory (SRAM), synchronous dynamic RAM (SDRAM)), bulk storage memory (e.g., CD-ROM and/or DVD-ROM, hard drives), and/or the like. The memory 1004 can include a non-transitory computer-readable storage medium having program instructions 1010 stored therein. The program instructions 1010 can include program modules 1012 that are executable by a computer processor (e.g., the processor 1006) to cause the functional operations described herein, including those described with regard to the UDP system 104, including those described with regard to method 300.

The processor 1006 can be any suitable processor capable of executing/performing program instructions. The processor 1006 can include a central processing unit (CPU) that carries out program instructions (e.g., the program instructions of the program module(s) 1012) to perform the arithmetical, logical, and input/output operations described herein. The processor 2006 can include one or more processors. The I/O interface 1008 can provide an interface for communication with one or more I/O devices 1014, such as a joystick, a computer mouse, a keyboard, a display screen (e.g., an electronic display for displaying a graphical user interface (GUI)), and/or the like. The I/O devices 1014 can include one or more of the user input devices. The I/O devices 1014 may be connected to the I/O interface 1008 via a wired or a wireless connection. The I/O interface 1008 can provide an interface for communication with one or more external devices 1016, such as other computers, networks, and/or the like. In some embodiments, the I/O interface 1008 includes an antenna, a transceiver, and/or the like. In some embodiments, the external devices 1016 include the upstream facility 102.

Further modifications and alternative embodiments of various aspects of the disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as examples of embodiments. Elements and materials may be substituted for those illustrated and described herein, parts and processes may be reversed or omitted, and certain features of the embodiments may be utilized independently, all as would be apparent to one skilled in the art after having the benefit of this description of the embodiments. Changes may be made in the elements described herein without departing from the spirit and scope of the embodiments as described in the following claims. Headings used herein are for organizational purposes only and are not meant to be used to limit the scope of the description.

It will be appreciated that the processes and methods described herein are example embodiments of processes and methods that can be employed in accordance with the techniques described herein. The processes and methods may be modified to facilitate variations of their implementation and use. The order of the processes and methods and the operations provided therein may be changed, and various elements may be added, reordered, combined, omitted, modified, etc. Portions of the processes and methods may be implemented in software, hardware, or a combination thereof. Some or all of the portions of the processes and methods may be implemented by one or more of the processors/modules/applications described herein.

As used throughout this application, the word "may" is used in a permissive sense (i.e., meaning having the potential to), rather than the mandatory sense (i.e., meaning must). The words "include," "including," and "includes" mean including, but not limited to. As used throughout this application, the singular forms "a", "an," and "the" include plural referents unless the content clearly indicates otherwise. Thus, for example, reference to "an element" may include a combination of two or more elements. As used throughout this application, the phrase "based on" does not limit the associated operation to being solely based on a particular item. Thus, for example, processing "based on" data A may include processing based at least in part on data A and based at least in part on data B, unless the content clearly indicates otherwise. As used throughout this application, the term "from" does not limit the associated operation to being directly from. Thus, for example, receiving an item "from" an entity may include receiving an item directly from the entity or indirectly from the entity (e.g., via an intermediary entity). Unless specifically stated otherwise, as apparent from the discussion, it is appreciated that throughout this specification discussions utilizing terms such as "processing," "computing," "calculating," "determining," or the like refer to actions or processes of a specific apparatus, such as a special purpose computer or a similar special purpose electronic processing/computing device. In the context of this specification, a special purpose computer or a similar special purpose electronic processing/computing device is capable of manipulating or transforming signals, typically represented as physical, electronic or magnetic quantities within memories, registers, or other information storage devices, transmission devices, or display devices of the special purpose computer or similar special purpose electronic processing/computing device.

What is claimed is:

1. An oil and gas upstream system comprising:
   an oil and gas upstream facility configured to generate upstream electronic data indicative of one or more characteristics of oil and gas upstream operations; and
   an oil and gas upstream data processing system configured to perform the following operations:
   identifying a set of electronic data files comprising the upstream electronic data;
   for each of the electronic data files of the set of electronic data files:
      extracting a first sample of contents of the electronic data file, the first sample comprising less than entire contents of the electronic data file; and
      applying a first hash function to the first sample to generate a first hash digest for the electronic data file;
   grouping the set of electronic data files into first groupings, each group of the first groupings comprising electronic data files having a same file size and a same first hash digest;
   for each group of the first groupings:
      for each of the electronic data files in the group:
         extracting a second sample of the contents of the electronic data file, the second sample of the electronic data file being different from the first sample of the electronic data file and comprising less than the entire contents of the electronic data file; and
         applying a second hash function to the second sample of the electronic data file to generate a second hash digest for the electronic data file;
      grouping the set of electronic data files into second groupings, each group of the second groupings comprising electronic data files having a same file size, a same first hash digest and a same second hash digest;
      for each group of the second groupings:
         for each of the electronic data files in the group:
            extracting a third sample of the contents of the electronic data file, the third sample of the electronic data file comprising the entire contents of the electronic data file; and
            applying a third hash function to the third sample to generate a third hash digest for the electronic data file; and
         determining sets of duplicate electronic data files of the set of electronic data files, each set of duplicate electronic data files comprising two or more electronic data files of the set of electronic data files having a same file size, a same first hash digest, a same second hash digest and a same third hash digest.

2. The system of claim 1, the operations further comprising:
   determining unique electronic data files of the set of electronic data files, each of the unique electronic data files comprising an electronic data file of the set of electronic data files that does not have a same file size, a same first hash digest, a same second hash digest and a same third hash digest as another electronic data file of the set of electronic data files.

3. The system of claim 1, wherein extracting the first sample of contents of the electronic data file comprises extracting bytes from the electronic data file at even intervals across a length of the electronic data file.

4. The system of claim 1, wherein extracting the second sample of contents of the electronic data file comprises extracting bytes from the electronic data file at random locations across a length of the electronic data file.

5. The system of claim 1, wherein extracting the first sample of the contents of the electronic data file comprises extracting bytes from a first set of locations across a length of the electronic data file, the operations further comprising:
   identifying a second set of locations that does not include any of the locations of the first set of locations, and
   wherein extracting the second sample of contents of the electronic data file comprises extracting bytes from the second set of locations such that the second sample does not include the bytes of any of the locations of the first set of locations.

6. The system of claim 1, the operations further comprising, for each set of the sets of duplicate electronic data files, automatically removing all but one of the two or more electronic data files of the set.

7. The system of claim 6, wherein automatically removing all but one of the two or more electronic data files of a set comprises inserting a link to the one of the two or more electronic data files not removed in place of each of the electronic data files of the set that are removed.

8. A method for assessing electronic data duplication, the method comprising:
   identifying a set of electronic data files;
   for each of the electronic data files of the set of electronic data files:
      extracting a first sample of contents of the electronic data file, the first sample comprising less than entire contents of the electronic data file; and
      applying a first hash function to the first sample to generate a first hash digest for the electronic data file;
   grouping the set of electronic data files into first groupings, each group of the first groupings comprising electronic data files having a same file size and a same first hash digest;
   for each group of the first groupings:
      for each of the electronic data files in the group:
         extracting a second sample of the contents of the electronic data file, the second sample of the electronic data file being different from the first sample of the electronic data file and comprising less than the entire contents of the electronic data file; and applying a second hash function to the second sample of the electronic data file to generate a second hash digest for the electronic data file;

grouping the set of electronic data files into second groupings, each group of the second groupings comprising electronic data files having a same file size, a same first hash digest and a same second hash digest;

for each group of the second groupings:
for each of the electronic data files in the group:
extracting a third sample of the contents of the electronic data file, the third sample of the electronic data file comprising the entire contents of the electronic data file; and
applying a third hash function to the third sample to generate a third hash digest for the electronic data file; and determining sets of duplicate electronic data files of the set of electronic data files, each set of duplicate electronic data files comprising two or more electronic data files of the set of electronic data files having a same file size, a same first hash digest, a same second hash digest and a same third hash digest.

9. The method of claim 8, further comprising:
determining unique electronic data files of the set of electronic data files, each of the unique electronic data files comprising an electronic data file of the set of electronic data files that does not have a same file size, a same first hash digest, a same second hash digest and a same third hash digest as another electronic data file of the set of electronic data files.

10. The method of claim 8, wherein extracting the first sample of contents of the electronic data file comprises extracting bytes from the electronic data file at even intervals across a length of the electronic data file.

11. The method of claim 8, wherein extracting the second sample of contents of the electronic data file comprises extracting bytes from the electronic data file at random locations across a length of the electronic data file.

12. The method of claim 8, wherein extracting the first sample of the contents of the electronic data file comprises extracting bytes from a first set of locations across a length of the electronic data file, the operations further comprising:
identifying a second set of locations that does not include any of the locations of the first set of locations, and
wherein extracting the second sample of contents of the electronic data file comprises extracting bytes from the second set of locations such that the second sample does not include the bytes of any of the locations of the first set of locations.

13. The method of claim 8, further comprising:
for each set of the sets of duplicate electronic data files, automatically removing all but one of the two or more electronic data files of the set.

14. The method of claim 13, wherein automatically removing all but one of the two or more electronic data files of a set comprises inserting a link to the one of the two or more electronic data files not removed in place of each of the electronic data files of the set that are removed.

15. A non-transitory computer readable storage medium comprising program instructions for assessing electronic data duplication, the program instructions executable by a computer processor to cause the following operations:

identifying a set of electronic data files;
for each of the electronic data files of the set of electronic data files:
extracting a first sample of contents of the electronic data file, the first sample comprising less than entire contents of the electronic data file; and
applying a first hash function to the first sample to generate a first hash digest for the electronic data file;

grouping the set of electronic data files into first groupings, each group of the first groupings comprising electronic data files having a same file size and a same first hash digest;

for each group of the first groupings:
for each of the electronic data files in the group:
extracting a second sample of the contents of the electronic data file, the second sample of the electronic data file being different from the first sample of the electronic data file and comprising less than the entire contents of the electronic data file; and
applying a second hash function to the second sample of the electronic data file to generate a second hash digest for the electronic data file;

grouping the set of electronic data files into second groupings, each group of the second groupings comprising electronic data files having a same file size, a same first hash digest and a same second hash digest;

for each group of the second groupings:
for each of the electronic data files in the group:
extracting a third sample of the contents of the electronic data file, the third sample of the electronic data file comprising the entire contents of the electronic data file; and
applying a third hash function to the third sample to generate a third hash digest for the electronic data file; and determining sets of duplicate electronic data files of the set of electronic data files, each set of duplicate electronic data files comprising two or more electronic data files of the set of electronic data files having a same file size, a same first hash digest, a same second hash digest and a same third hash digest.

16. The medium of claim 15, the operations further comprising:
determining unique electronic data files of the set of electronic data files, each of the unique electronic data files comprising an electronic data file of the set of electronic data files that does not have a same file size, a same first hash digest, a same second hash digest and a same third hash digest as another electronic data file of the set of electronic data files.

17. The medium of claim 15, wherein extracting the first sample of contents of the electronic data file comprises extracting bytes from the electronic data file at even intervals across a length of the electronic data file.

18. The medium of claim 15, wherein extracting the second sample of contents of the electronic data file comprises extracting bytes from the electronic data file at random locations across a length of the electronic data file.

19. The medium of claim 15, wherein extracting the first sample of the contents of the electronic data file comprises extracting bytes from a first set of locations across a length of the electronic data file, the operations further comprising:
identifying a second set of locations that does not include any of the locations of the first set of locations, and
wherein extracting the second sample of contents of the electronic data file comprises extracting bytes from the second set of locations such that the second sample does not include the bytes of any of the locations of the first set of locations.

20. The medium of claim 15, the operations further comprising:

for each set of the sets of duplicate electronic data files, automatically removing all but one of the two or more electronic data files of the set.

21. The medium of claim 20, wherein automatically removing all but one of the two or more electronic data files of a set comprises inserting a link to the one of the two or more electronic data files not removed in place of each of the electronic data files of the set that are removed.

* * * * *